United States Patent
Keller et al.

(10) Patent No.: US 11,808,715 B2
(45) Date of Patent: Nov. 7, 2023

(54) TARGET FOR OPTICAL MEASUREMENT OF TRENCHES

(71) Applicant: Onto Innovation Inc., Wilmington, MA (US)

(72) Inventors: Nicholas James Keller, La Jolla, CA (US); George Andrew Antonelli, Portland, OR (US)

(73) Assignee: Onto Innovation Inc., Wilmington, MA (US)

( * ) Notice: Subject to any disclaimer, the term of this patent is extended or adjusted under 35 U.S.C. 154(b) by 274 days.

(21) Appl. No.: 17/231,508

(22) Filed: Apr. 15, 2021

(65) Prior Publication Data

US 2021/0325317 A1 Oct. 21, 2021

Related U.S. Application Data

(60) Provisional application No. 63/011,856, filed on Apr. 17, 2020.

(51) Int. Cl.
*G01N 21/95* (2006.01)
(52) U.S. Cl.
CPC .................. *G01N 21/9505* (2013.01)
(58) Field of Classification Search
CPC . G01N 21/9505; G03F 7/70683; H01L 22/12; H01L 22/34
See application file for complete search history.

(56) References Cited

U.S. PATENT DOCUMENTS

| | | | |
|---|---|---|---|
| 8,912,495 B2 | 12/2014 | Lange | |
| 9,601,396 B2 | 3/2017 | Lian | |
| 10,854,511 B2 * | 12/2020 | Chen | H01L 21/32135 |
| 11,152,386 B2 * | 10/2021 | Or-Bach | G11C 16/0416 |
| 2012/0243770 A1 | 9/2012 | Kaneko et al. | |

FOREIGN PATENT DOCUMENTS

| | | |
|---|---|---|
| KR | 1020140122608 | 10/2014 |
| KR | 1020190052721 | 5/2019 |

OTHER PUBLICATIONS

International Search Report and Written Opinion dated Aug. 17, 2021, from PCT application No. PCT/US2021/027714, filed Apr. 16, 2021.

\* cited by examiner

*Primary Examiner* — Seung C Sohn
(74) *Attorney, Agent, or Firm* — Paradice & Li LLP

(57) ABSTRACT

A metrology target is designed for measuring a feature at the bottom of a trench in a device under test, such as a tungsten recess vertical profile in a wordline in a three-dimensional (3D) NAND. The metrology target follows the design rules for the device under test and includes a tier stack with a plurality of tier stack pairs including, each including a conductor layer, such as tungsten, and an insulator layer, such as silicon dioxide and a trench that extends through the tier stack pairs. The metrology target includes a via that extends through the tier stack pairs and is positioned a lateral distance to the trench to promote access of light to a bottom of the trench, via plasmonic resonance, for measurement of a characteristic of the trench, such as the tungsten recess at the bottom of the wordline slit.

30 Claims, 14 Drawing Sheets

Produce an optical metrology target on a wafer with the device under test, the optical metrology target comprising a tier stack comprising a plurality of tier stack pairs, each tier stack pair comprising a conductor layer and an insulator layer, the tier stack comprising a trench extending through the tier stack, and a plurality of vias extending through the plurality of tier stack pairs, wherein a lateral distance from a via to the trench promotes access of light to a bottom of the trench for measurement of the characteristic of the trench 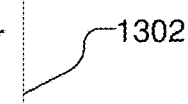

Produce light with wavelengths longer than a plasmon frequency of the conductor layer in each tier stack pair with an optical metrology device that is focused on the optical metrology target, wherein plasmonic resonance of the light promotes access of the light to the bottom of the trench 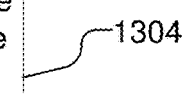

Detect light returned from the optical metrology target with the optical metrology device 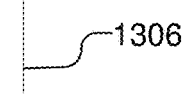

Use the detected light to measure the characteristic of the trench 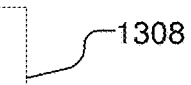

Fig. 13

TARGET FOR OPTICAL MEASUREMENT OF TRENCHES

CLAIM OF PRIORITY UNDER 35 U.S.C. § 119

This application claims under 35 U.S.C. § 119 the benefit of and priority to U.S. Provisional Application No. 63/011, 856, filed Apr. 17, 2020, and entitled "TARGET FOR OPTICAL MEASUREMENT OF TRENCHES," which is assigned to the assignee hereof and is incorporated herein by reference in its entirety.

FIELD OF THE DISCLOSURE

Embodiments of the subject matter described herein are related generally to optical metrology targets, and more particularly to a target design for monitoring characteristics in a high aspect ratio trench.

BACKGROUND

Semiconductor and other similar industries often use optical metrology equipment to provide non-contact evaluation of substrates during processing. With optical metrology, a sample under test is illuminated with light, e.g., at a single wavelength or multiple wavelengths. After interacting with the sample, the resulting light is detected and analyzed to determine a desired characteristic of the sample.

One type of sample that is particularly difficult to measure optically is a device with many stacked layers. For example, three-dimensional (3D) memory technologies, such as vertical NAND flash, rely on the stacking of multiple layers of memory cells. The number of layers scales directly with the amount of memory. Accordingly, manufacturers are increasing the number of layers in order to increase memory. The increase in layers occurs while the channel size remains roughly the same leading to an increasing aspect ratio of these devices. By way of example, with 64 layers in a device structure, current metrology systems struggle to obtain dimensional information from the top to the bottom of the structures at various points in the process flow. As devices scale above 64 layers to, e.g., 96 layers or more, the metrology problem intensifies and some structures cannot be measured using conventional optical metrology. The underlying physical problem with measuring device structures having many layers or high aspect ratios is that photons cannot physically reach features at the bottom of the structure and/or return to the detector for measurement.

SUMMARY

An optical metrology target, as described herein, is designed to provide non-destructive optical measurement of features at the bottom of a trench in a device at test. By way of example, the trench may be the wordline (WL) slit in a three-dimensional (3D) NAND device, and the measured feature may be the tungsten (W) recess at the bottom of the WL slit. By enabling optical measurement of features at the bottom of the trench, the vertical profile of the features in the trench may be measured. The metrology target is fabricated with the device under test and includes a tier stack with a plurality of tier stack pairs, each including a conductor layer and insulator layer, e.g., tungsten and silicon dioxide, respectively. A trench extends through the plurality of tier stack pairs. The metrology target is designed with the same critical features of the device under test, such as the critical dimension of the trench and, e.g., the W-recess, but otherwise may vary from the device under test while following the same design rules. The metrology target includes a via that extends through the tier stack. The via does not simulate structures in the device under test, i.e., the device under test does not include similar vias. The vias are designed to promote access of light to the bottom of the WL slit to enable the measurement of the characteristic at the bottom of the trench, e.g., the W-recess. The via, for example, may be designed with a lateral distance from the trench that promotes the access of light to the bottom of the trench, which may occur through a process known as plasmonic resonance. A plurality of vias may be included in the tier stack to provide structural support to the tier stack during fabrication. The metrology target may be measured, for example, using an optical metrology device, such as a reflectometric, ellipsometer, Mueller Matrix ellipsometer, Fourier-transform infrared spectroscopy (FTIR), etc., that uses light longer than the plasmon frequency of the conductor layer in the tier stack pairs, i.e., Epsilon_1 of the dielectric function is negative.

In one implementation, a wafer includes an optical metrology target for measuring a characteristic of a trench in a device under test, wherein the trench has a depth that is difficult for light to reach to a bottom of the trench. The device under test, for example, may be a three-dimensional (3D) NAND. The optical metrology target may include a tier stack that includes a plurality of tier stack pairs, each tier stack pairs includes a conductor layer and an insulator layer, and the tier stack includes a trench vertically extending through the plurality of tier stack pairs. The optical metrology target may include a plurality of vias extending through the plurality of tier stack pairs. Each via includes insulating sidewalls and is filled with a conductor material. A lateral distance from a via to the trench in the optical metrology target for measurement of the characteristic of the trench.

In one implementation, a wafer includes an optical metrology target for measuring a characteristic of a trench, wherein the trench has a depth that is difficult for light to reach to a bottom of the trench. The optical metrology target may include a tier stack that includes a plurality of tier stack pairs. The tier stack includes a trench vertically extending through the plurality of tier stack pairs. The optical metrology target may include a plurality of vias extending through the plurality of tier stack pairs. The plurality of vias comprise a means for promoting access of light to the bottom of the trench for measurement of the characteristic of the trench.

In one implementation, a method of measuring a characteristic of a trench in a device under test. The method may include producing an optical metrology target on a wafer with the device under test. The optical metrology target may include a tier stack that includes a plurality of tier stack pairs, each of which includes a conductor layer and an insulator layer and a trench extending through the plurality of tier stack pairs. The optical metrology target may include a plurality of vias extending through the plurality of tier stack pairs. A lateral distance from a via to the trench promotes access of light to a bottom of the trench for measurement of the characteristic of the trench. The method may further include producing light with wavelengths longer than a plasmon frequency of the conductor layer in each tier stack pair, with an optical metrology device that is focused on the optical metrology target, wherein plasmonic resonance of the light promotes access of the light to the bottom of the trench. Light returned from the optical metrology target is detected with the optical metrology device and used to measure the characteristic of the trench.

In one implementation, an optical metrology device is configured to measure a characteristic of a trench in a device under test using an optical metrology target on a wafer with the device under test. The optical metrology target may comprise a tier stack including a plurality of tier stack pairs, each tier stack pair including a conductor layer and an insulator layer. The tier stack includes a trench extending through the tier stack, and a plurality of vias extending through the plurality of tier stack pairs, wherein a lateral distance from a via to the trench promotes access of light to a bottom of the trench for measurement of the characteristic of the trench. The optical metrology device may include a light source that produces light to be directed to and interact with the optical metrology target. The light produced by the light source has wavelengths longer than a plasmon frequency of the conductor layer in each tier stack pair, wherein plasmonic resonance of the light promotes access of the light to the bottom of the trench, wherein the light is directed to the optical metrology target. The optical metrology device may further include at least one detector that receives the light that is returned from the optical metrology target. The optical metrology device may further include at least one processor coupled to the at least one detector, wherein the at least one processor is configured to use the detected light to measure the characteristic of the trench.

BRIEF DESCRIPTION OF THE DRAWINGS

FIG. 13 is a flow chart illustrating a method of measuring a W-recess vertical profile in a WL in a three-dimensional (3D) NAND.

DETAILED DESCRIPTION

Figure 1A:
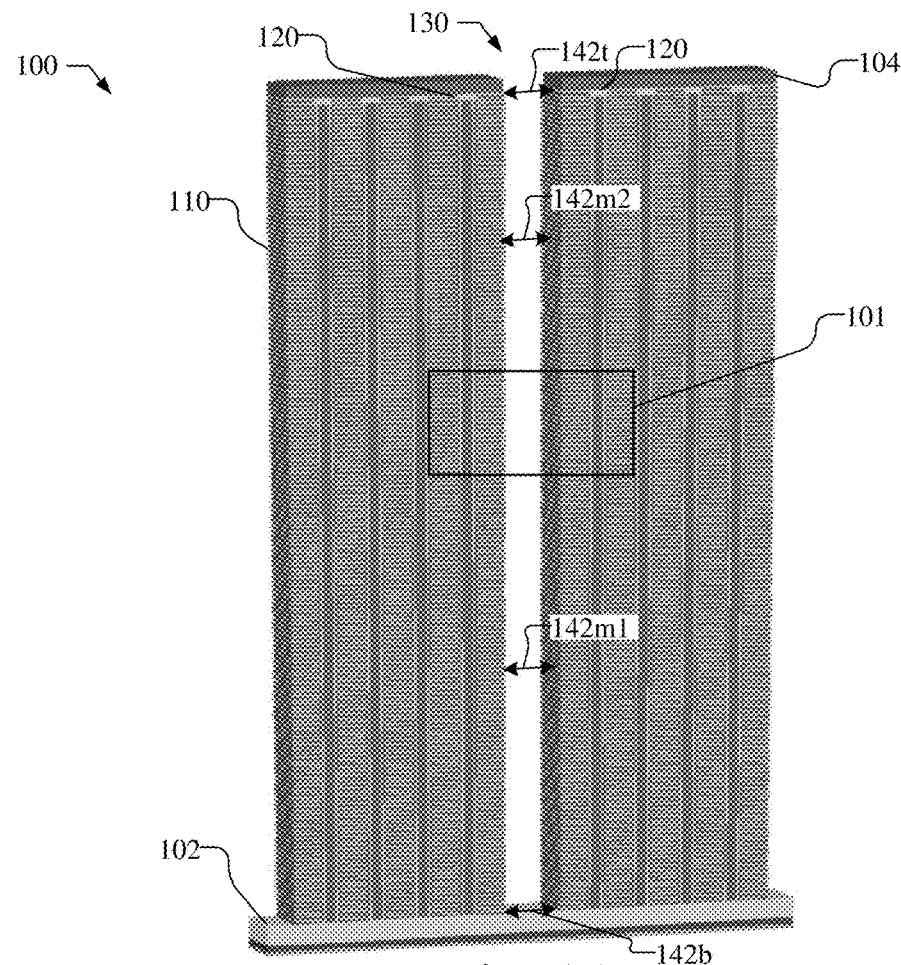
FIGS. 1A and 1B illustrate an isometric and close up side view of a 3D-NAND device structure under fabrication that includes a tungsten (W) recess.

During fabrication of semiconductor and similar devices it is sometimes necessary to monitor the fabrication process by non-destructively measuring the devices. Optical metrology is sometimes employed for non-contact evaluation of samples during processing. One type of sample that is particularly difficult to measure optically is a device with a trench with a high aspect ratio, i.e., a narrow trench that is very deep. In some instances, devices are being produced with trenches that are narrower than the wavelength of light being used to measure the devices and that may extend through many layers of, e.g., 64, 96, or more layers of opaque material. Current metrology systems struggle to obtain dimensional information from the top to the bottom of devices having 64 layers. As devices scale above 64 layers to, e.g., 96 layers or more, the metrology problem will intensify and some measurements will not be possible using conventional optical metrology, such as characterizing deep trenches. The underlying physical problem with devices having many layers or high aspect ratios is that photons cannot reach the bottom of the structure and/or return to a detector. Particular wavelengths of light may be used to assist in penetration of multi-layer devices, however, it has been found that even with careful selection of the wavelengths of light it is not possible to measure the bottom of trenches in the devices being fabricated. Accordingly, as discussed herein, specialized optical metrology targets that include the same features, e.g., trenches, as the device under test, and also include features that enable access of light to the bottom of the trench may be employed to measure characteristics of the trench.

One example of a device having trenches that are difficult to measure using conventional optical metrology is a 3D NAND device. The fabrication process of 3D NAND devices is complex and requires many depositions, lithography, etch, and fill steps. During fabrication of 3D NAND devices, one critical feature is the tungsten (W)-recess in the wordline (WL) slit, which has a direct impact on device yield and performance. It is desirable to measure and evaluate structures during fabrication, particularly after critical process steps, to ensure the structure is within tolerance. Currently, only destructive measurement techniques are capable of measuring the vertical profile of the W-recess in the WL of a 3D NAND. For example, destructive techniques such as etch-back Scanning Electron Microscopy (SEM) and cross-sectional SEM measurements may be used. These techniques, however, are destructive and consequently are unsuitable for inline evaluation of critical process steps during fabrication.

An optical metrology target, as described herein, may be used to provide a non-destructive optical measurement of features at various depths of a high aspect ratio trench in a device, such as the WL in a 3D NAND device, or other devices. One example of a feature of a trench that may be measured using an optical metrology target is the W-recess vertical profile in the WL of a NAND device, including the W-recess at the bottom of the WL slit, although other characteristics may be measured. The metrology targets as discussed herein may be located within scribe lines between chips or possibly may be located within the chips, e.g., in active areas of the chips. The metrology targets are designed with the same critical features of the structure under test, such as the critical dimension of the WL slit and W-recess, but otherwise may vary from the structure under test while following design rules. For example, instead of channel holes used in 3D NAND, tungsten vias may be used in the metrology target. The location of the tungsten vias in the metrology target is designed to promote access of light to the bottom of the WL slit. For example, the distance from the tungsten vias to the WL slit in the metrology target is selected to promote access of light to the bottom of the WL slit. Accordingly, structures at the bottom of the WL slit, including the W-recess, may be optically measured, thereby providing a full vertical profile of the W-recess in the WL of the 3D NAND under test. The metrology target, by way of example, may be measured using an optical metrology device, such as a reflectometric, ellipsometer, Mueller Matrix ellipsometer, FTIR, etc., e.g., using mid-infrared or longer wavelengths. Shorter wavelengths may be used if the wavelengths are longer than the plasmon frequency of the tungsten, i.e., Epsilon_1 of the dielectric function is negative.

Figure 1B:
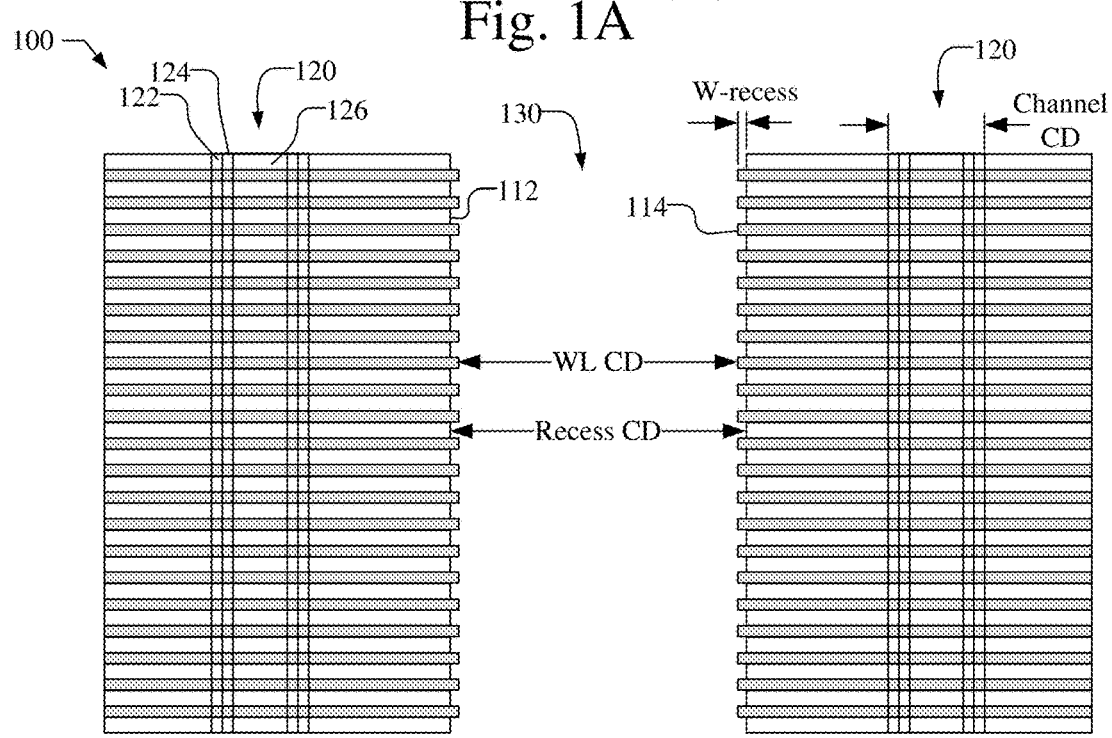

FIG. 1A, by way of example, illustrates an isometric view of a 3D-NAND device structure 100 during fabrication and FIG. 1B illustrates a close-up view of box 101 in FIG. 1A showing the W-recess structure in the WL slit 130. FIGS. 1A and 1B illustrate a tier stack 110 that includes a number of alternating layers of tungsten 112 and silicon dioxide 114 (or other type of insulating material) on a substrate 102, with a hard mask 104 shown on the top surface of the tier stack 110. Each bilayer of silicon dioxide 114 and tungsten 112 may be referred to as a tier stack pair, and the full tier stack 110 includes a large number, e.g., 256, of tier stack pairs. It should be understood that there may be additional layers between the silicon dioxide layer 114 and the tungsten layer 112, such as layers of layers of a High-K dielectric and layers of Titanium Nitride (TiN) that may be deposited before the tungsten layer 112. Channel holes 120 are formed in each tier stack with a critical dimension illustrated as Channel CD. The channel holes 120 may include, e.g., silicon oxide-silicon nitride-silicon oxide (ONO) 122 and polysilicon sidewalls 122 and is filled with silicon oxide 126. Additional or different materials may be present, e.g., such as an oxide liner. It should be understood that the materials and layers, e.g., within the channel holes 120 may vary based on manufacturer.

As illustrated, a WL slit 130 is present in the tier stack. As can be seen in FIG. 1B, the distance between silicon dioxide layers 114 at the same layer level in the WL slit 130, i.e., the width of the WL slit 130 at a silicon dioxide layer 114, may be referred to as the WL critical dimension (WL CD). The distance between tungsten layers 112 at the same layer level in the WL slit 130 may be referred to as the Recess CD. The tungsten recess (W-recess) is the recess of the tungsten layer 112 in the WL slit 130 relative to a silicon dioxide layer 114, e.g., the distance from the edge of the tungsten layer 112 to the edge of the silicon dioxide layer 114. Thus, W-recess and Recess CD at any vertical position in the WL slit 130 are related by the WL-CD and may be used interchangeably.

To measure the W-recess vertical profile in the WL slit 130, the W-recess (or comparably, the Recess CD) is measured at a plurality of vertical positions in the WL slit 130, e.g., at the bottom layer 142b, a first mid layer 142m1, a second mid layer 142m2, and at the top layer 142t. Optical measurement of the W-recess below the top layer 142t, however, is challenging because it necessarily occurs after the gate replacement process during which sacrificial silicon nitride layers (not shown) are selectively etched away from the sides of the WL slit and replaced with various materials to generate, e.g., a gate and charge trap (not shown), including tungsten to produce the tungsten layers 112.

The tungsten layers 112 make the entire structure opaque to light in the visible and near infra-red regions, e.g., less than 2500 nm, beyond the first few layers in the tier stacks 110. Consequently, optical measurement of the W-recess vertical profile, e.g., including a measurement of the bottom W-recess (at layer 142b) is not possible with these wavelengths. Optical metrology using mid-infrared and longer wavelengths (e.g., greater than 2500 nm) improves penetration of light. However, as 3D NAND scales, both the WL pitch and number of tier stack pairs increase, which causes an exponential loss of measurement sensitivity to the W-recess at the bottom of the WL slit, when using mid-infrared light.

Figure 2B:
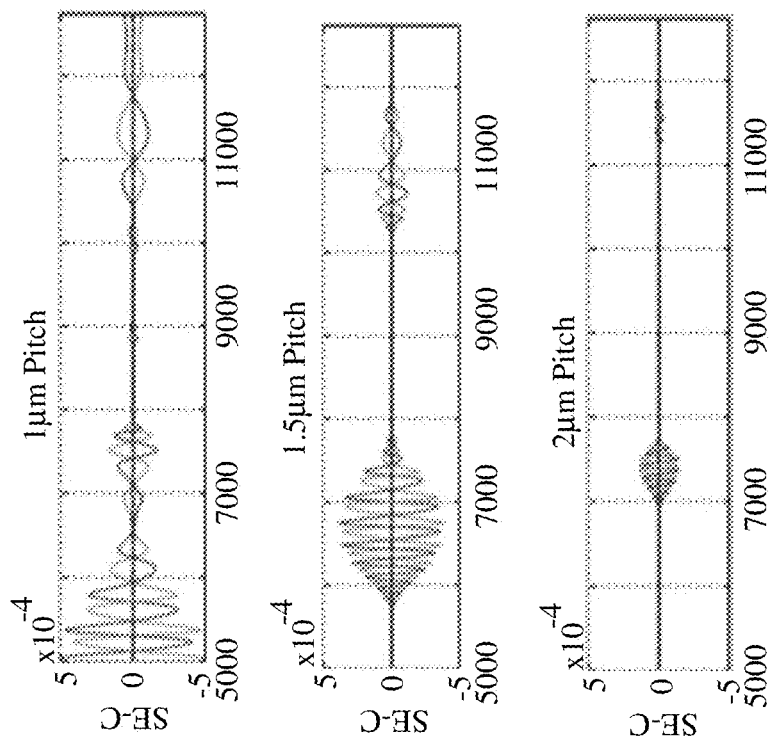
FIG. 2B illustrates the decreasing intensity of spectroscopic ellipsometry (SE) measurements for the W-recess at the bottom of the WL slit with respect to the pitch of the WL slit.
Figure 2A:
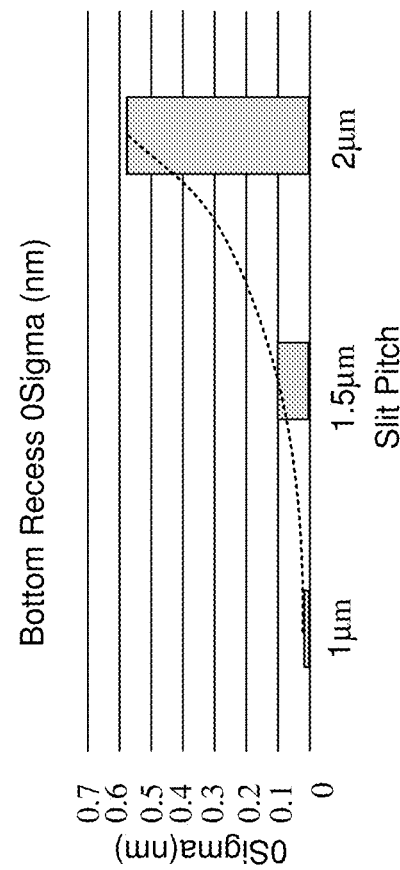
FIG. 2A is a graph illustrating an increase in measurement uncertainty for the W-recess at the bottom of a wordline (WL) slit with respect to the pitch of the WL slit.

FIGS. 2A and 2B are a graph and sensitivity curves, respectively, for a simulation of a mid-infrared measurement of the W-recess at the bottom of the WL slit in a metrology target having 192 pair W-recess structures. FIG. 2A is a graph illustrating the increase in measurement uncertainty (0Sigma) with respect to WL slit pitch, and FIG. 2B illustrates the amplitude of spectral response of spectroscopic ellipsometry (SE) C parameter measurements with respect to wavelength. As can be seen in FIGS. 2A and 2B, the sensitivity of the measurements decreases as the WL slit pitch increases and optical measurement of the bottom W-recess in the 3D NAND device itself is not possible.

Simulations of potential metrology targets showed that sensitivity to the bottom W-recess in the structure show high measurement sensitivity if the metrology target has either a sub-1 μm WL pitch with 3 to 4 Channel Holes per WL, or if the WL CD is 2 to 3 times larger than the WL CD, e.g., of a process of record (POR) NAND device, and have a 1.5 μm pitch, with 9 Channel Holes per WL.

Figures 3A, 3B:
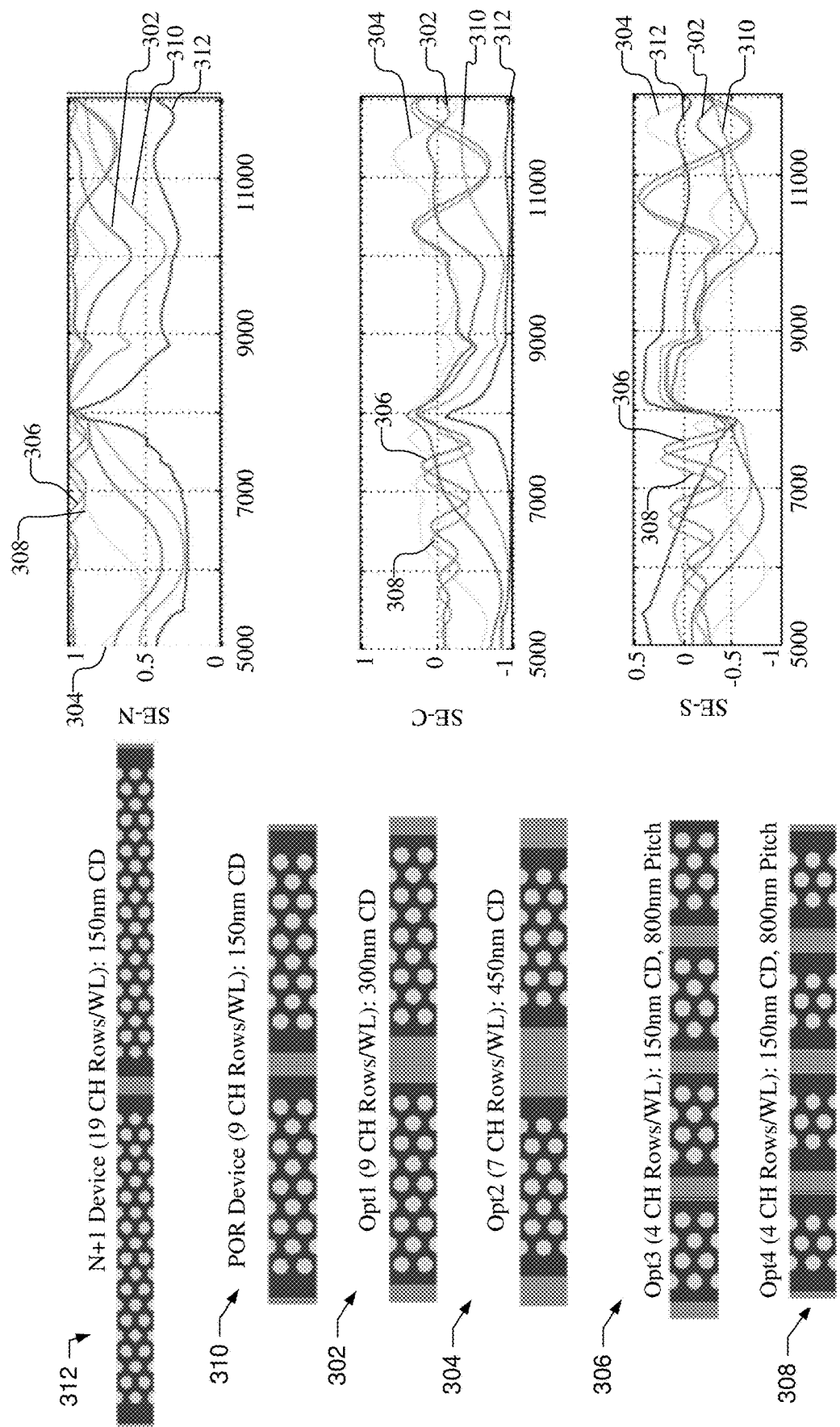
FIG. 3A illustrates a top plan view of number of NAND devices and possible metrology target layouts modeling the NAND device structure.
FIG. 3B illustrates the raw spectra simulations for SE parameters for the NAND devices and metrology target layouts shown in FIG. 3A.

FIG. 3A illustrates a top plan view of number of proposed target layouts 302, 304, 306, and 308 for possible metrology targets and 3D NAND device structures 310 and 312, which are POR and N+1 (e.g., next node) devices, respectively. FIG. 3B illustrates the raw spectra simulations for SE parameters S, C, and N using wavelengths between 5000 nm and 12000 nm for the targets and devices shown in FIG. 3A, using the same reference numbers to identify curves corresponding to the layouts shown in FIG. 3A.

As can be seen, the structures of the proposed targets 302-308 are the same as the structure of the 3D NAND devices 310 and 312, but have different dimensions. For example, as illustrated, the POR NAND device structure 310 has 9 channel rows per WL and a 150 nm WL CD, while the N+1 NAND device structure 312 has 19 channel rows per WL and a 150 nm WL CD. Proposed target 302 has 9 channel rows per WL with a 300 nm WL CD, target 304 has 7 channel rows per WL with a 450 nm WL CD, target 306 has 4 channel rows per WL with a 150 nm WL CD and an 800 nm pitch, and target 308 has 3 channel rows per WL with a 150 nm WL CD and an 800 nm pitch.

Figure 4:
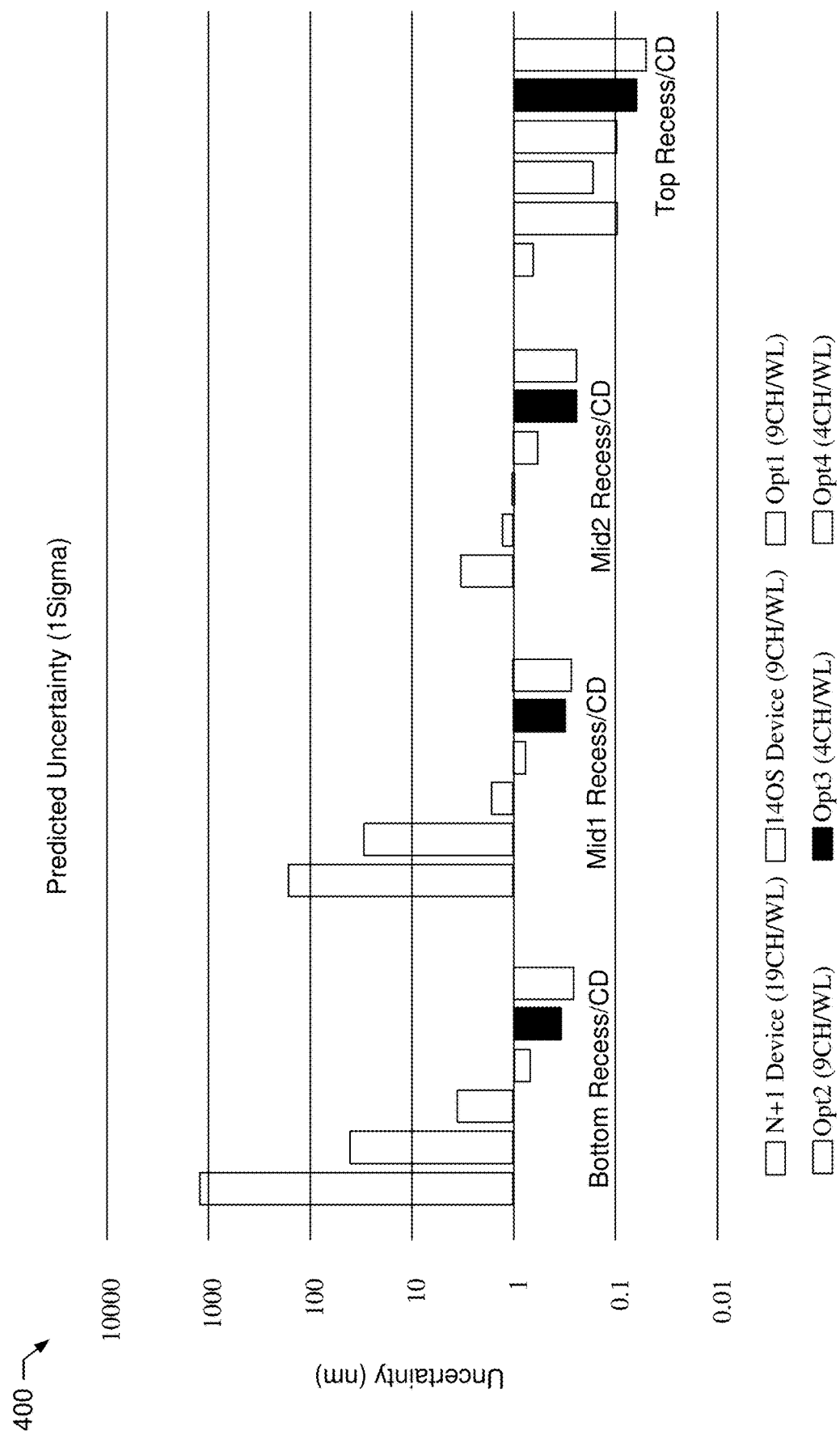
FIG. 4 is a graph illustrating the predicted measurement uncertainty for the W-recess at a number of vertical positions of the WL slit in the NAND devices and metrology target layouts shown in FIG. 3A.

FIG. 4 is a graph 400 illustrating the predicted uncertainty (1Sigma) (nm) at the bottom W-recess (142b in FIG. 1A), the midi W-recess (142m1), mid2 W-recess (142m2), and the top W-recess (142t) for the metrology targets 302-308 and the NAND devices 310-312. As can be seen, the predicted uncertainty for proposed targets 304, 306, and 308, has sub-nm uncertainty for the bottom W-recess. Note that essentially no light reaches the bottom of the WL slit in the N+1 device 412, e.g., the uncertainty is greater than 1 µm.

While proposed targets 304, 306, and 308 have sub-nm uncertainty for the bottom W-recess, these metrology targets cannot be fabricated as 3D-NAND scales to N+1 (and to pitches approaching 3 µm), as they will violate design rules for the 3D-NAND. Due to how the devices are fabricated, the violation of design rules by making a smaller WL pitch or larger WL CD in a metrology target may cause defects not only in the metrology target, but in other devices on the wafer and may destroy the wafer. Thus, a metrology target design for a NAND device must follow the same design rules as the NAND device. For example, a metrology target for a N+1 NAND device is required to have the same pitch as the N+1 NAND device, e.g., approximately 3 µm, which as illustrated above, will not have the desired measurement sensitivity for the bottom W-recess.

Figure 5A:
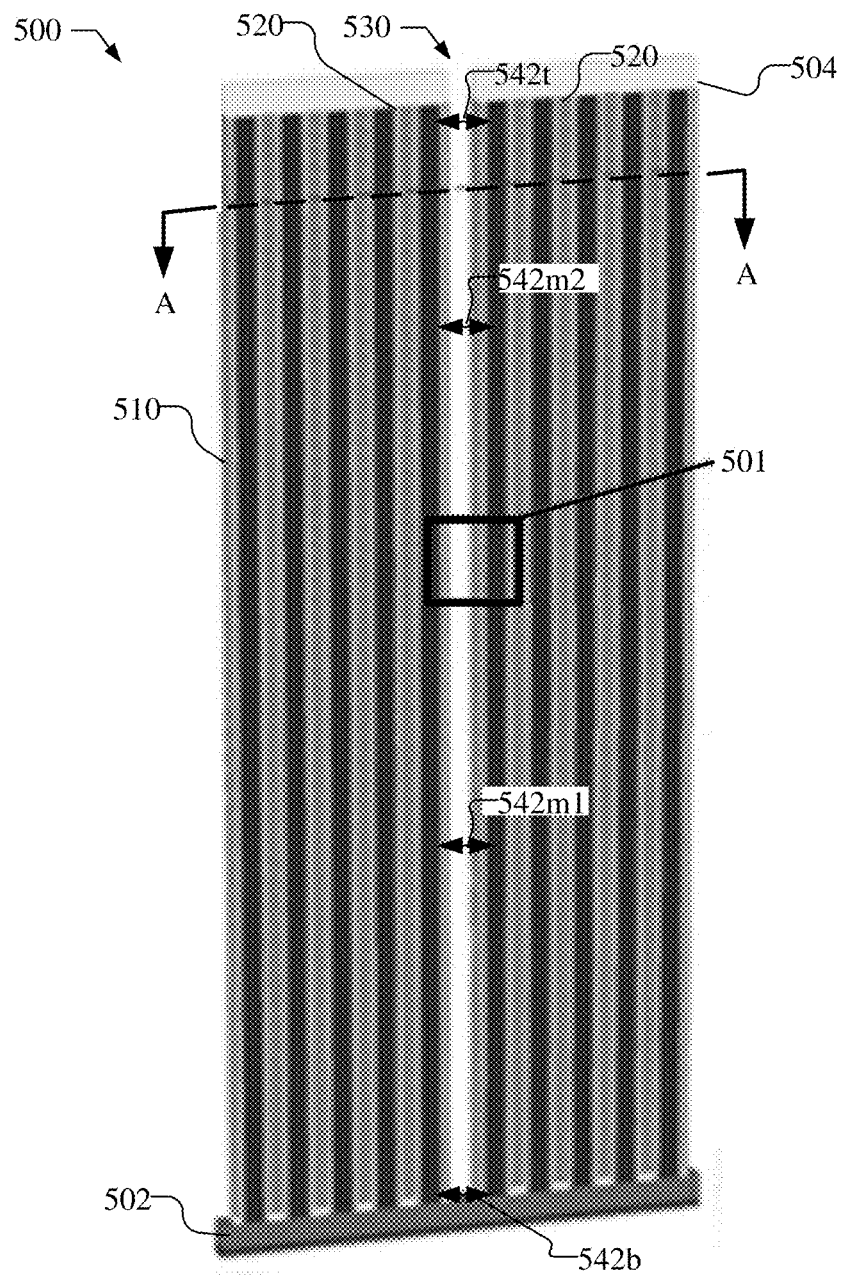
FIGS. 5A, 5B, and 5C illustrate isometric, cross-sectional plan, and close up views, respectively, of a metrology target that may be used to measure the bottom W-recess, and thus, the vertical profile of the W-recess in a WL slit of a 3D NAND device.
Figure 5B:
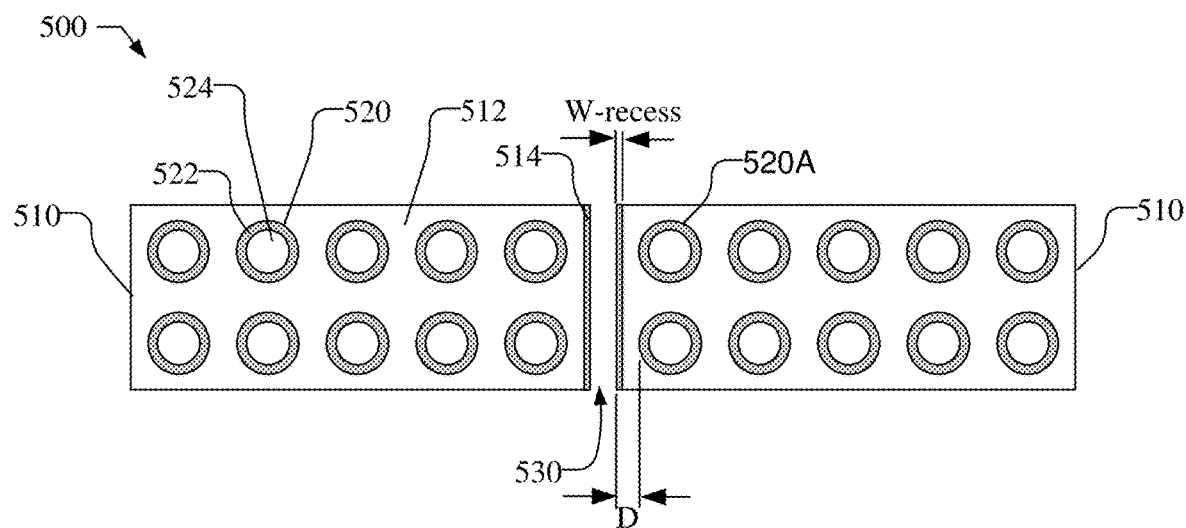
Figure 5C:
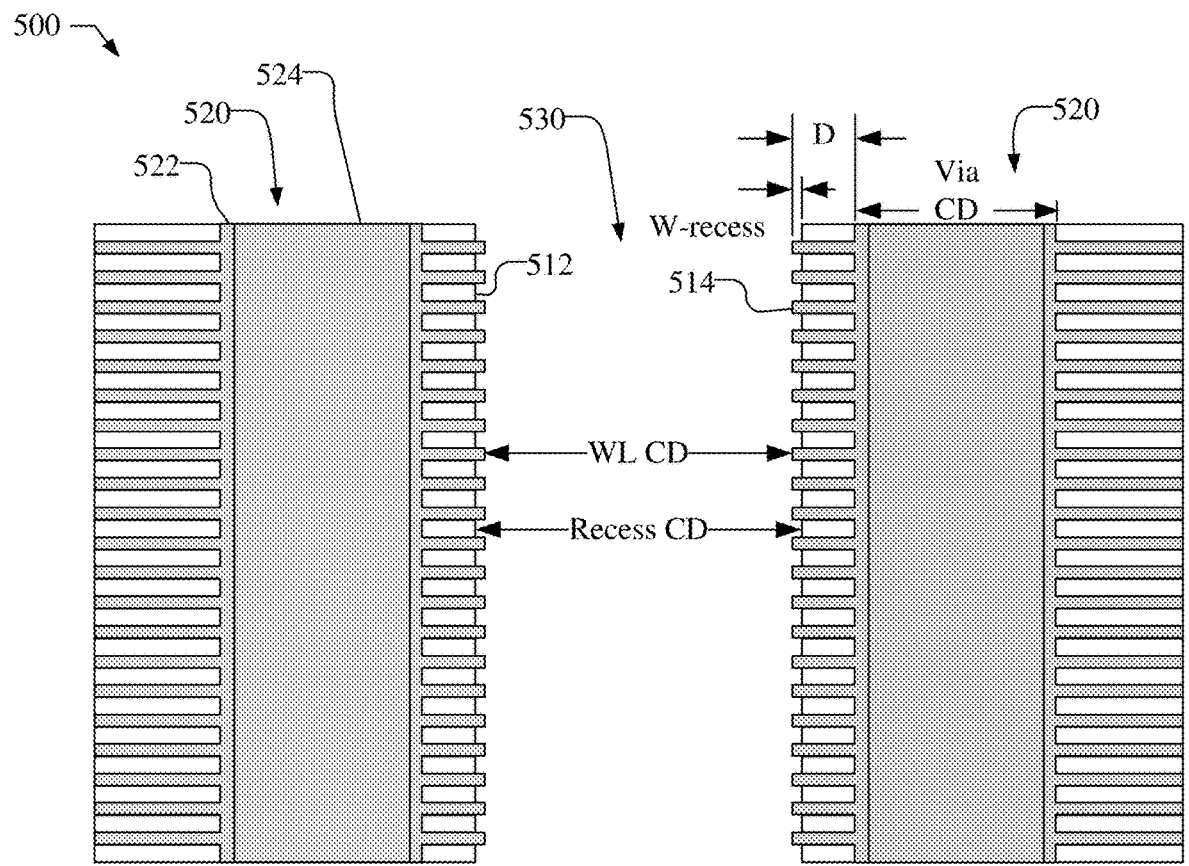

FIGS. 5A, 5B, and 5C illustrate isometric, cross-sectional plan, and close up views, respectively, of metrology target 500 that may be used to measure structures at the bottom of the WL slit of a 3D NAND device while following the design rules for the NAND device. For example, metrology target 500 may be used to measure the bottom W-recess, and thus, the vertical profile of the W-recess in a WL slit of a 3D NAND device. Metrology target 500, for example, is located on a wafer along with the device under test. The metrology target 500 may be located within scribe lines between chips or may be located within the chips, e.g., in active areas of the chips.

The metrology target 500 is fabricated at the same time as the device under test and similar to the NAND device shown in FIGS. 1A and 1B, includes tier stack 510 that includes a number of alternating layers of tungsten 512 and silicon dioxide 514 (or other type of insulating material) on a substrate 502, with a hard mask 504 shown on the top surface of the tier stack 510. Each bilayer of silicon dioxide 514 and tungsten 512 may be referred to as a tier stack pair, and the full tier stack 510 includes the same number of tier stack pairs as the NAND device under test. It should be understood that there may be additional layers between the silicon dioxide layer 514 and the tungsten layer 512, such as layers of a High-K dielectric and layers of Titanium Nitride (TiN) that may be deposited before the tungsten layer 512. The metrology target 500 includes a WL slit 530 in the tier stack 510. The metrology target 500 is designed with the same critical features as the 3D NAND under test, such as the same pitch and WL slit CD, and is fabricated at the same time as the device under test. Accordingly, the tungsten 512 and silicon dioxide 514 layers have the same dimensions as the tungsten 112 and silicon dioxide 114 layers in the device under test, e.g., 3D NAND shown in FIGS. 1A and 1B. It should be understood that the slit 530 in metrology target 500 is designed with the same dimensions and is fabricated along with WL slit 130 in the NAND device under test and, accordingly, even though metrology target 500 is not a 3D NAND with an operating WL, the slit 530 in metrology target 500 is referred to herein as the WL slit 530.

The metrology target 500 includes a plurality of tungsten vias 520, which form a tungsten grating in each tier stack 510. FIG. 5B, by way of example, illustrates a cross-sectional plan view of the metrology target 500 through a tungsten layer 512 along dimension A-A shown in FIG. 5A, and FIG. 5C illustrates a close up view of box 501 shown in FIG. 5A and illustrate the plurality of tungsten vias 520. The tungsten vias 520, which are sometimes referred to as a Via to Periphery (VtP) structure, extend through all of the alternating tungsten 512 and silicon dioxide layer 514. The tungsten vias 520 include sidewalls 522 of silicon dioxide and are filled 524 with tungsten. The tungsten vias 520 are used in place of the channel holes 120 in the 3D NAND device and are not intended to model the channel holes 120 in materials or design. In other words, the device under test, e.g., the 3D NAND device, does not include vias that correspond to the plurality of vias in the optical metrology target. The via CD may be 2 to 3 times the size of the channel CD. The number, dimension, and layout of the tungsten vias 520 may be selected per the design rules and to provide structural support for the tier stacks 510 during fabrication. Additionally, the design and placement of the tungsten vias 520 is selected to promote access of light to the bottom of the WL slit 530, and thus, to enhance measurement sensitivity at the bottom of the WL slit 530. For example, with proper selection and design of the tungsten vias 520, the measurement sensitivity of the bottom W-recess may be improved by several orders of magnitude relative to the N+1 NAND device.

For example, the lateral distance (D) between the via 520A and the WL slit 530, as shown in FIGS. 5B and 5C, may be selected to promote access of light to the bottom of the WL slit 530. Accordingly, with proper design and placement of the tungsten vias 520, e.g., including the lateral distance (D) between the via 520A and the WL slit 530, measurement sensitivity of the W-recess at the bottom of the WL slit 530 is enhanced, and non-destructive optical measurements of the W-recess is possible at a plurality of vertical positions in the WL slit 530, including the bottom layer 542b, a first mid layer 542m1, a second mid layer 542m2, and the top layer 542t, shown in FIG. 5A. Because the parameters of the WL slit 530 of the metrology target 500 are the same as the WL slit 130 in the 3D NAND device under test, metrology target 500 enables optical measurement of features of the WL slit 130, such as the W-recess vertical profile of the 3D NAD device under test. Other features of the WL slit 130 may likewise be measured, such as the bottom CD, based on the light accessing the bottom of the WL slit 530.

It should be understood that FIGS. 5A, 5B, and 5C illustrate only a portion of the optical metrology target 500 and the optical metrology target 500 may include a number of additional vias and WL slits of the same design that will be illuminated at the same time during measurement. For example, in an optical metrology target that is 50 µm×50 µm, there may be approximately 100 vias 520 in the Y direction (up and down directions in FIG. 5B) and approximately 16 wordline slits 530 in the X direct (left and right in FIG. 5B).

The tungsten vias 520 may be fabricated, for example, by etching the vias 520 after the Channel Holes and the Staircase but before the WL etch in the device under test. The vias 520 are first etched, then the silicon dioxide sidewalls 522 are produced, followed by the tungsten fill.

Metrology targets having similar design, e.g., with via to trench distances that is designed to promote access of light to the bottom of the trench, may be used to measure characteristics of trenches in devices other than 3D NAND devices. An optical metrology target, such as optical metrology target 500, may be used for measuring a characteristic of a trench in a device under test, such as the WL slit of 3D NAND device or a trench in another type of device, wherein light cannot access a bottom of the trench in the device under test. The optical metrology device may include a tier stack comprising a plurality of tier stack pairs, each tier stack pair comprising a conductor layer, such as layer that comprises tungsten, and an insulator layer, such as a layer that includes silicon dioxide. The tier stack may also include a trench vertically extending through the plurality of tier stack pairs, such as a WL slit 530. The optical metrology target further includes a plurality of vias, e.g., vias 520, extending through the plurality of tier stack pairs. The vias may have insulating sidewalls, e.g., of silicon dioxide, and filled with a conductor material, such as tungsten. A lateral distance from a via to the trench promotes access of light to a bottom of the trench in the optical metrology target for measurement of the characteristic of the trench, such as the W-recess at the bottom of the trench or the W-recess vertical profile.

Figure 6:
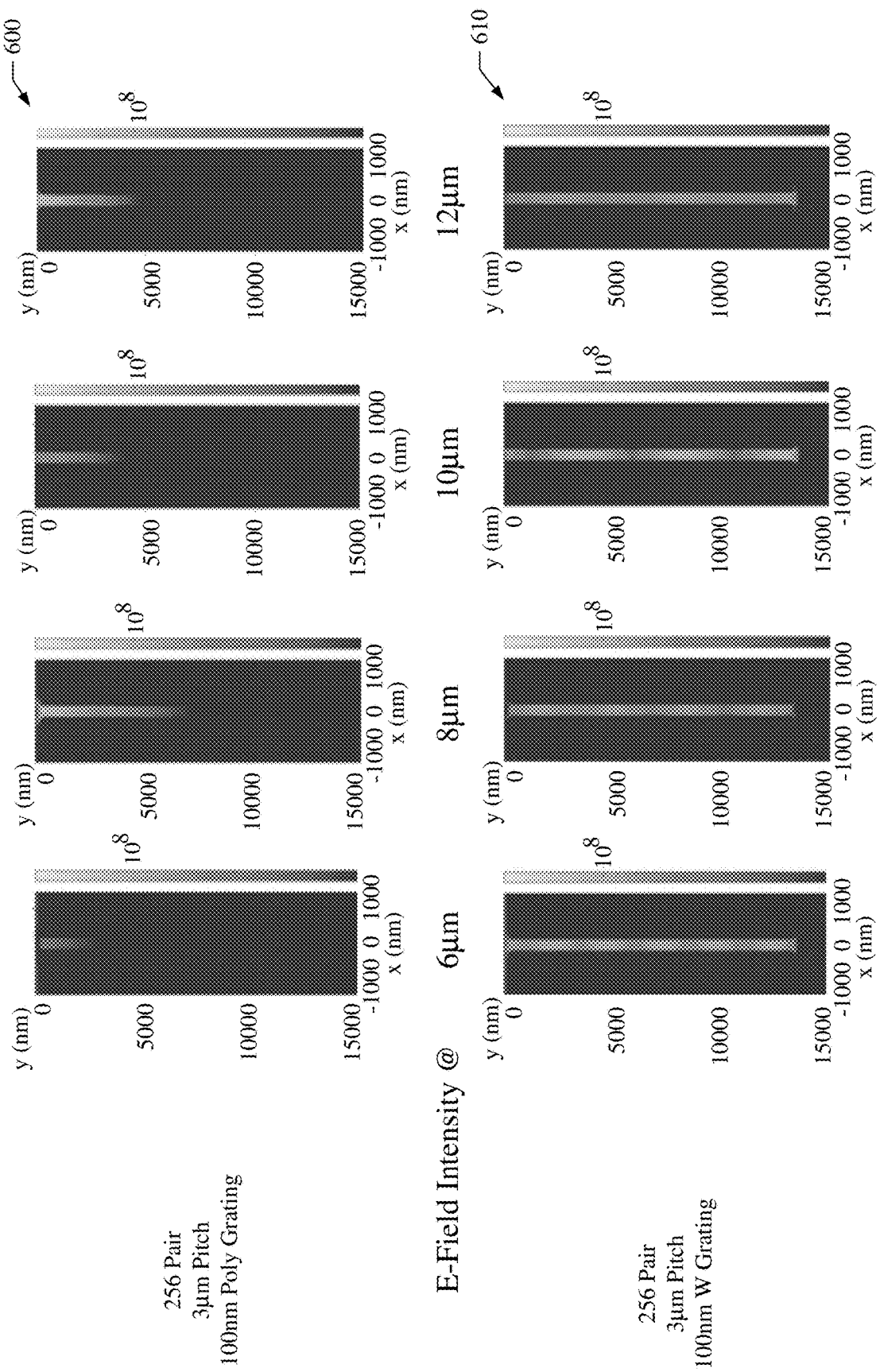
FIG. 6 illustrates a two-dimensional finite-difference frequency-domain (FDFD) simulation at four different wavelengths illustrating the difference in e-field intensity with respect to depth of a WL slit for a structure with poly-silicon channel holes and a similar structure with tungsten vias.)

FIG. 6, by way of example, illustrates a two-dimensional finite-difference frequency-domain (FDFD) simulations 600 and 610 at four different wavelengths (6 µm, 8 µm, 10 µm, and 12 µm) illustrating the difference in the e-field intensity with respect to the depth of a WL slit for a structure with a poly-silicon channel holes (Poly-Si grating) and a similar structure with a tungsten vias (W grating), respectively. The 2D simulated structures used in simulations 600 and 610 are a 256 tier stack pair (N+1) structure with a 3 µm pitch. The simulation 600 is for a structure with a 100 nm lightly doped Poly-Si grating 300 nm from the center of the WL slit and the simulation 610 is for a structure with a 100 nm W grating 300 nm from the center of the WL. The 2D structures used in the simulation 600 and 610 were designed to mimic the actual devices, e.g., with the structure for simulation 600 including channel holes lined with Poly-Si, similar to channel holes 120, and the structure for simulation 610 including tungsten filled vias, e.g., vias 520.

As can be seen in the simulation 600, with Poly-Si lined channel holes, the mid-infrared e-fields have a maximum extension of approximately halfway down the WL slit at a single wavelength (8 µm) and significantly less for the other wavelengths. Simulation 610 shows that for a structure with tungsten filled vias, the e-field extends to the bottom of the tungsten lined structure for all four simulated wavelengths. It is believed that the tungsten vias 520A grating adjacent to the WL slit produces plasmonic resonance in the longer wavelengths, e.g., in wavelengths in the mid-infrared region and beyond, which promotes access of the light to the bottom of the WL slit. Conversely, the Poly-Si in the structure for simulation 600 is absorbing of wavelengths throughout the MIR range and does not support plasmonic resonance, e.g., because the real part of the dielectric function is always positive. Consequently, light is unable to reach the bottom of the WL slit for such structures as illustrated in simulation 600.

Figure 7A:
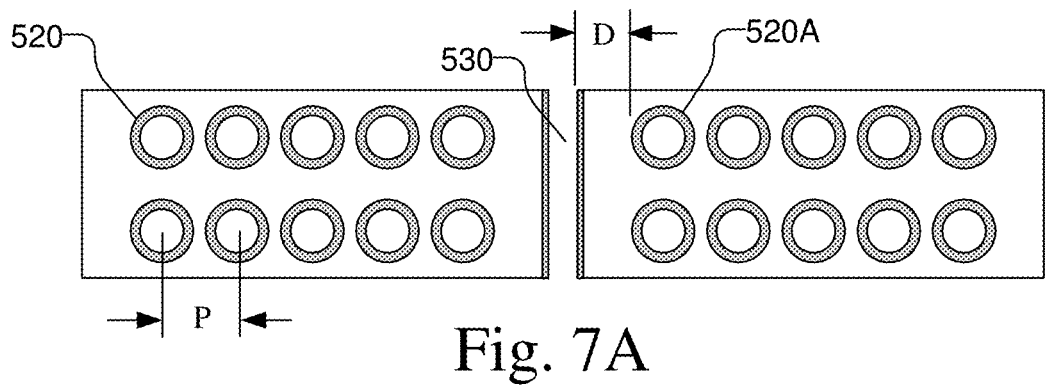
FIGS. 7A, 7B, and 7C illustrate cross-sectional plan views of a metrology target with various means for promoting access of light to the bottom of the WL slit.
Figure 7B:
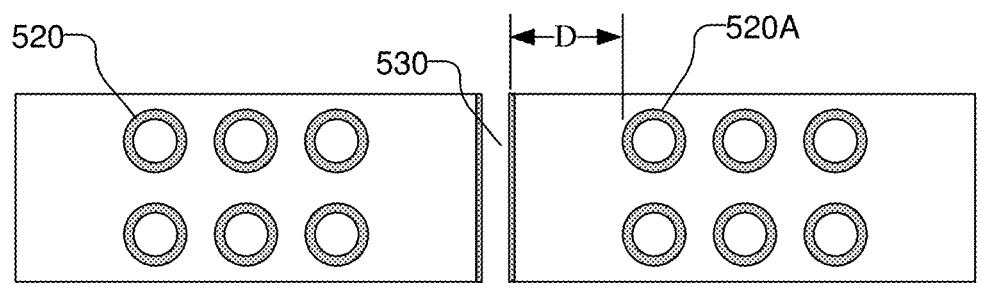
Figure 7C:
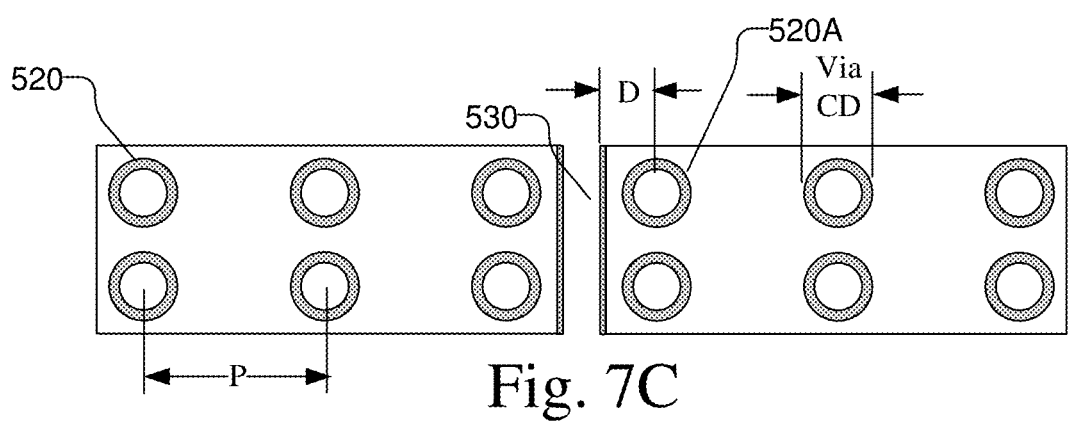

The design of the metrology target 500, including the tungsten vias 520 and in particular the closest tungsten via 520A to the WL slit 530 may be selected to promote access of light to the bottom of the WL slit. For example, a nominal WL pitch may be approximately 3 µm and via diameter may be 300 nm, but these dimensions may vary. The design of the metrology target 500, including the lateral distance D between the via 520A and WL slit 530, may be selected based on various parameters including the number of alternating tungsten 112 and silicon dioxide 114 layers, the thickness of the layers, the depth of the WL slit 530, the nominal size of the W-recess, etc. FIGS. 7A-7C, by way of example, illustrate cross-sectional plan views of the metrology target 500 with various means for promoting access of light to the bottom of the WL slit. For example, as illustrated in FIG. 7A, the lateral distance D between the via 520A and WL slit 530 may be selected by controlling the pitch P of the plurality of vias 520. FIG. 7B illustrates that the lateral distance D between the via 520A and WL slit 530 may be selected based on the selection of the number of vias 520. FIG. 7C illustrates that the lateral distance D between the via 520A and WL slit 530 may be controlled based on selection of the number of vias 520, controlling the pitch P, and controlling the via CD.

Figure 8:
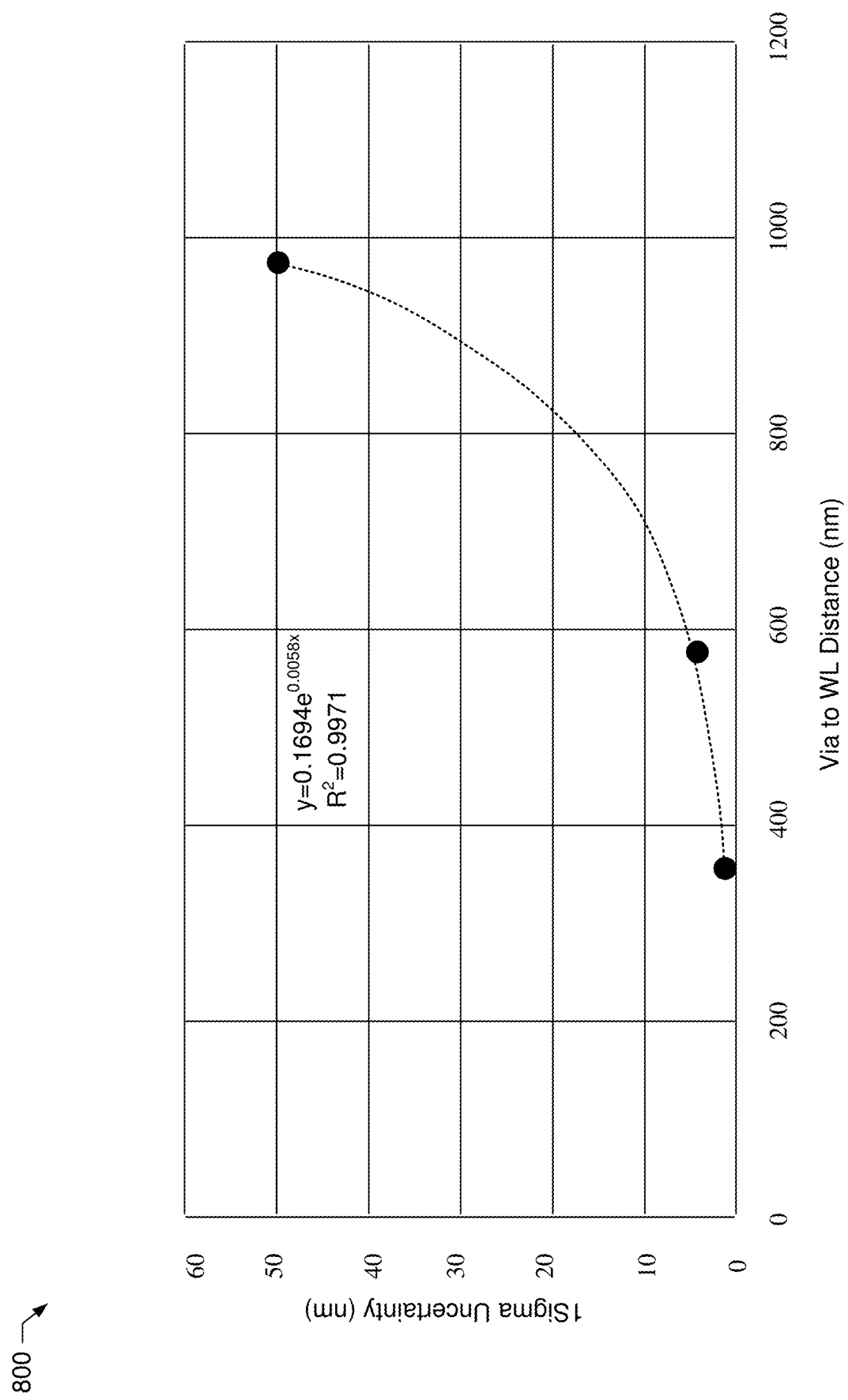
FIG. 8 is a graph illustrating a simulation of the measurement uncertainty for the bottom W-recess with respect to the tungsten via distance from the WL slit.

FIG. 8 is a graph 800 illustrating a simulation of the bottom W-recess measurement uncertainty (1Sigma) with respect to the lateral distance D between the tungsten via 520A from the WL slit. The simulation was done utilizing a tungsten via 520 structure shown in FIGS. 5A, 5B, and 5C, with constant via diameter and density, only the spacing between vias was changed, and therefore the via to WL distance changed. As can be seen in graph 800, metrology targets with tungsten vias closest to center of the WL slit had the highest measurement sensitivity to the bottom W-recess. For example, a via to WL distance D of approximately 350 nm has substantially greater sensitivity to the bottom W-recess than a via to WL distance D of approximately 950 nm, and an exponential relationship between the via to WL distance and uncertainty exists.

Figure 9B:
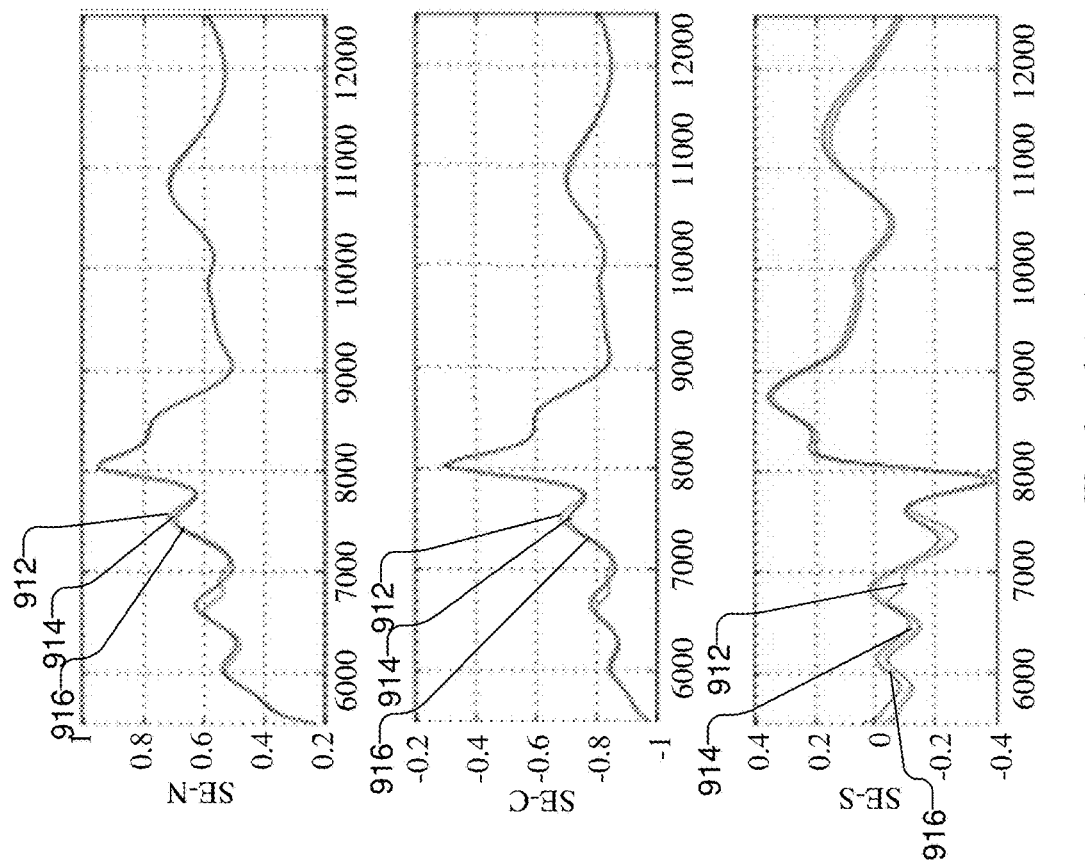
FIG. 9B illustrates a raw spectral comparison for SE parameters for the tier stacks shown in FIG. 9A.
Figure 9A:
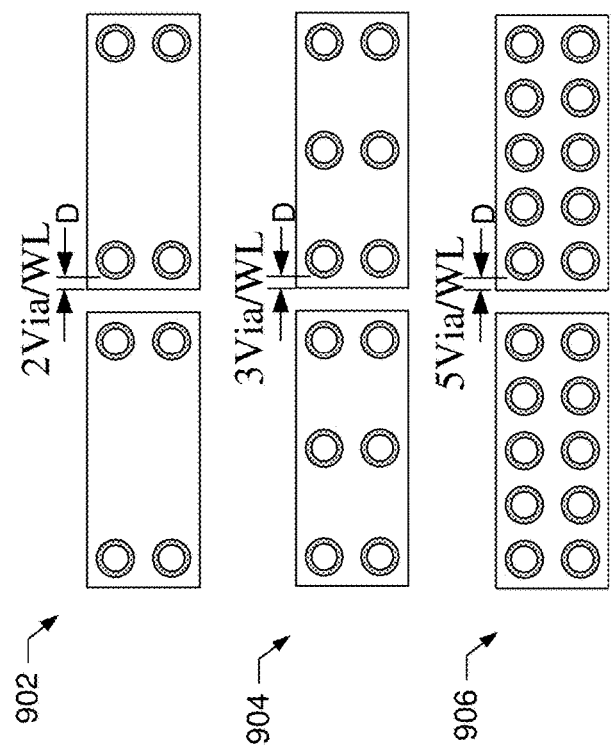
FIG. 9A illustrates cross sectional views of tier stacks have 2, 3, and 5 tungsten vias per WL slit each having the same via to WL slit distance.

FIG. 9A illustrates cross sectional plan views of a portion of tier stacks from different targets, with one target having a tier stack 902 including 2 tungsten vias per WL slit with a 2000 nm pitch and a 350 nm WL CD, another target having a tier stack 904 with 3 tungsten vias per WL slit with a 1000 nm pitch and a 350 nm WL CD, and another target having a tier stack 906 with 5 tungsten vias per WL slit with a 500 nm pitch and 350 nm WL CD, where each structure has the same via to WL slit distance D. FIG. 9B illustrates a raw spectral comparison of SE parameters N, C, and S for the tier stacks shown in FIG. 9A, with curve 912 representing the spectral curve for tier stack 902, curve 914 representing the spectral curve for tier stack 904, and curve 916 representing the spectral curve for tier stack 906. As can be seen in FIG. 9B, the spectral curves for the different tier stacks 902, 904, and 906 closely match. The small spectral difference observed between the 2 via tier stack 902 and the 3 and 5 via tier stacks 904 and 906 may be attributed to interaction at the top surface of the tier stack structure.

As illustrated in FIGS. 9A and 9B, the density of the tungsten vias, e.g., the number of vias per WL, perpendicular to the WL slit has no effect on the sensitivity to the bottom W-recess, or sensitivity of the W-recess in the vertical direction (Z). Thus, the theory that light is confined between the WL slit 530 and the vias 520A on either side of the WL slit 530, as illustrated in the 2D FDFD simulations shown in FIG. 6, appears to be verified.

Figure 10:
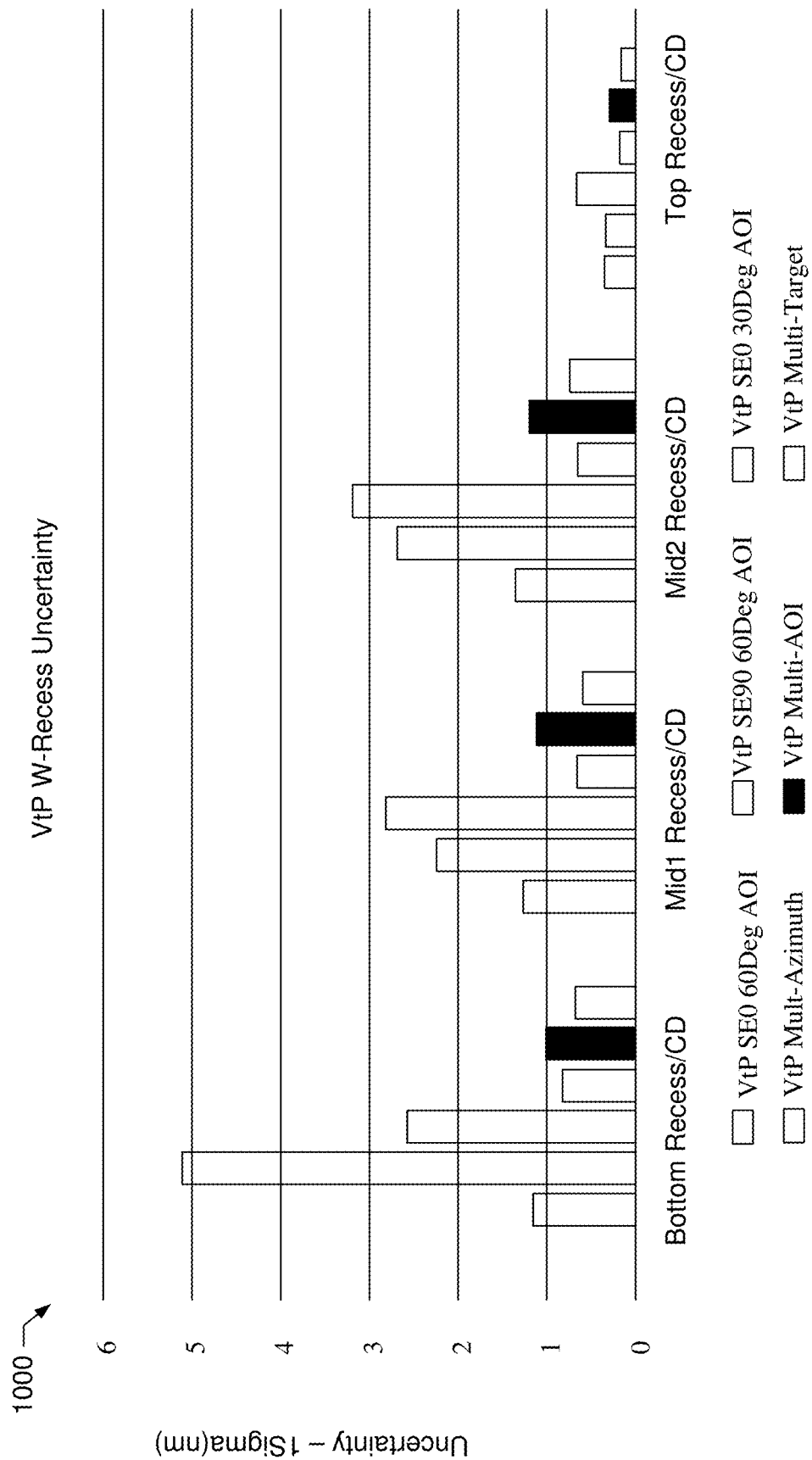
FIG. 10 is a chart illustrating the simulated measurement uncertainty for the W-recess at a number of vertical positions of the WL slit in the metrology target for single and multi-modal measurements.

FIG. 10 is a chart 1000 illustrating the simulated measurement uncertainty for the W-recess at various vertical positions (bottom 542$b$, midi 542$m$1, mid2 542$m$2, and top 542$t$), for single and multi-modal measurements. Specifically, the chart 1000 illustrates the uncertainty (1Sigma) for measurements of a metrology target with tungsten vias, as illustrated in FIGS. 5A, 5B, and 5C, for SE measurements performed at 0° azimuth angle and 60° AOI, 90° azimuth angle and 60° AOI, 0° azimuth angle and 30° AOD, for multiple azimuth angles (0° and 90°), multiple AOI (30° and 60°), and using multiple targets (e.g., two separates areas of a metrology target with a programmed shift in the via to WL space of approximately 200 nm with respect to each other). As illustrated in FIG. 10, the uncertainly improves using multiple azimuth angles, e.g., 0° and 90°, and multiple metrology targets, by 1.4× and 1.6×, respectively.

Figures 11A, 11B:
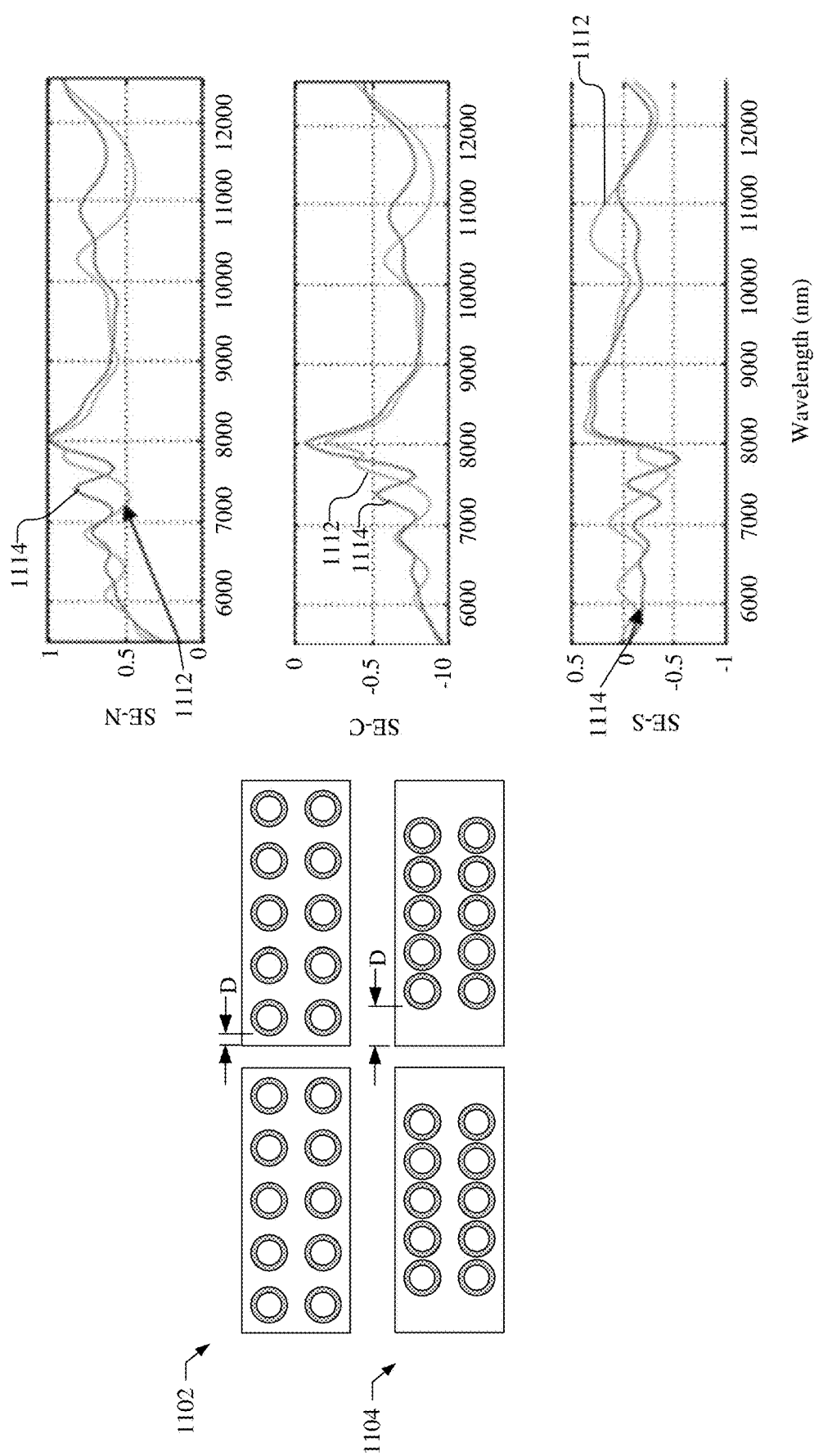
FIG. 11A illustrates proposed metrology targets having with different offsets in the via to WL slit distance.
FIG. 11B illustrates the raw spectral comparison for SE parameters for the tier stacks shown in FIG. 11A.

FIG. 11A illustrates cross sectional views of two areas on an optical metrology target having tier stacks 1102 and 1104 with offsets in the via to WL slit distance D with respect to each other. For example, the offset in the via to WL slit distance D between the two areas may differ by approximately 200 nm, and as illustrated is achieved by changing the pitch of the tungsten vias. If desired, the via to WL slit distance D may be altered in other ways, such as the number of tungsten vias used, the placement of the tungsten vias, etc., as illustrated in FIGS. 7A-7C. FIG. 11B, illustrates the raw spectral comparison for SE parameters N, C, and S for the tier stacks 1102 and 1104 shown in FIG. 11A, with curve 1112 representing the spectral curve for tier stack 1102, and curve 1114 representing the spectral curve for tier stack 1104. As illustrated in FIG. 11B, a change in the via to WL slit distance D produces a change in the spectral response. As discussed in reference to FIG. 10, multiple areas of a metrology target, such as those illustrated in FIG. 11A, may be measured together and used in a multimodal, global fitting process to determine the W-recess at various vertical positions with reduced uncertainty relative to a single measurement fitting process.

Thus, with use of the metrology target 500, which may have one or more areas with different via to WL slit distances D for measurement, and which meets the design rules for the 3D NAND device under test, and with proper selection and design of the tungsten vias 520, such as the via 520A to WL slit distance D, access of light to the bottom of the WL slit is promoted and the measurement uncertainty (1sigma) for the W-recess at the bottom of the WL slit may be improved from greater than 1 μm (as illustrated in FIG. 4) to less than 1 nm, which is an improvement of 3 orders of magnitude.

Figure 12:
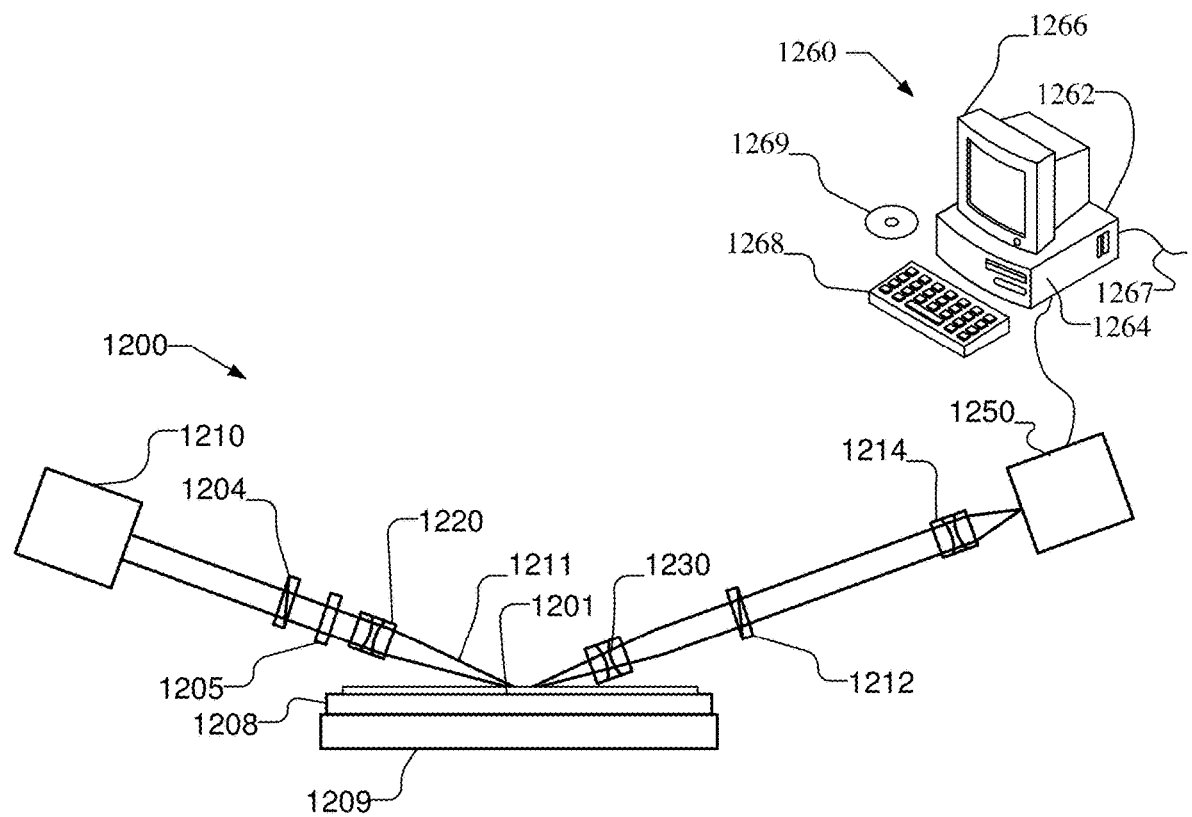
FIG. 12 illustrates a schematic view of an optical metrology device capable of collecting and analyzing data from the proposed metrology target to measure the vertical profile of the W-recess in the WL slit of a 3D NAND device under test.

The optical metrology target, and thus, the device under test, may be measured using an optical metrology device, such as a reflectometric, ellipsometer, Mueller Matrix ellipsometer, FTIR, etc. The metrology device may use light have wavelengths that are longer than the plasmon frequency of the tungsten, i.e., Epsilon_1 of the dielectric function is negative. In some implementations, mid-infrared or longer wavelengths may be used, but shorter wavelengths may be used if the wavelengths are longer than the plasmon frequency of the tungsten. FIG. 12, by way of example, illustrates a schematic view of an optical metrology device 1200 that may be used to collect and analyze data from an optical metrology target, as described herein, to measure a characteristic of a trench in a device under test, such as the W-recess vertical profile in the WL slit of a 3D NAND device. Other features of the trench, such as the bottom CD may be similarly determined using the optical metrology target. The optical metrology device 1200 may be configured to perform, e.g., spectroscopic reflectometry, ellipsometry measurements, including Mueller Matrix ellipsometry measurements, or FTIR measurements, of a sample 1201 that includes the metrology target 500 using light, e.g., having wavelengths that are longer than the plasmon frequency of the tungsten.

Optical metrology device 1200 includes a light source 1210 that produces light 1212. The light 1212, for example, may be in the infrared spectral region, such as the mid-infrared or longer spectral region. For example, light source 1210 may produce infrared light having wavelengths between 2.5 μm and 30 μm. Shorter wavelengths may be used if the wavelengths are longer than the plasmon frequency of the tungsten. The light 1212 produced by light source 1210 may include a range of wavelengths, i.e., broadband, or may be monochromatic. The tier stack of the optical metrology target, however, may be opaque to the light 1212, and thus, light cannot access the bottom of a trench of the optical metrology target without the presence of the vias and proper selection of the via to trench distance as discussed above.

The optical metrology device 1200 includes focusing optics 1220 and 1230 that focus and receive the light and direct the light to be obliquely incident on a top surface of the sample 1201. The optics 1220, 1230 may be refractive, reflective, or a combination thereof and may be an objective lens. The focusing optics may include coatings or be manufactured from materials appropriate for use with the wavelengths of light used, such as Gold or Aluminum coatings on a metal or glass substrate for reflective elements or Zinc Selenide, Silicon, Germanium, Magnesium Fluoride, Barium Fluoride, or Calcium Fluoride for refractive elements.

The reflected light may be focused by lens 1214 and received by a detector 1250 receives the reflected light. The detector 1250 may include one or more single pixel photodetector elements, e.g., a monolithic chip with a single pixel that is sensitive to infrared light. The size of the detector element may be selected to be consistent with the beam size at the plane of the detector element. The detector 1250 may be matched to the output range of the light source 1210. For example, a thermo-electrically cooled (TEC) Mercury Cadmium Telluride (MCT) detector may be used with a light source that produces wavelengths in a mid-infrared spectral region, e.g., approximately 5 μm to 13 μm. A liquid nitrogen cooled MCT detector may be used for low signal levels, or Deuterated-Triglycine Sulfate based elements (DTGS) for applications with high reflection values and potential MCT detector saturation. In embodiments where the wavelength range is approximately 2 μm to 5 μm, Lead Selenide (PbSe), Indium Antimonide (InSb), or Indium Gallium Arsenide (InGaAs) based detectors may be used for enhanced detectivity.

One or more polarizing elements may be in the beam path of the optical metrology device 1200. For example, as illustrated in FIG. 12, optical metrology device 1200 may include one or both (or none) of a polarizing element 1204 in the beam path before the sample 1201, and a polarizing element (analyzer) 1212 in the beam path after the sample 1201, and may include one or more additional elements, such as a compensator of photoelastic modulator 1205. For example, Zinc Selenide wire grid polarizers may be used to control the input polarization state as well as the final state of the beam before it excites the detecting element in detector 1250.

The detector 1250 may be coupled to at least one processor 1260, such as a workstation, a personal computer, central processing unit or other adequate computer system, or multiple systems. It should be understood that one processor, multiple separate processors or multiple linked processors may be used, all of which may interchangeably be referred to herein as processor 1260, at least one processor 1260, one or more processors 1260. The processor 1260 is preferably included in, or is connected to, or otherwise associated with, optical metrology device 1200. The processor 1260, for example, may control the positioning of the sample 1201, e.g., by controlling movement of a stage 1209 that is coupled to the chuck. The stage 1209, for example, may be capable of horizontal motion in either Cartesian (i.e., X and Y) coordinates, or Polar (i.e., R and θ) coordinates or some combination of the two. The stage may also be capable of vertical motion along the Z coordinate. The processor 1260 may further control the operation of the chuck 1208 to hold or release the sample 1201. The processor 1260 may also collect and analyze the data obtained from the detector 1250. The processor 1260 may analyze the data to determine one or more physical characteristics of the sample 1201 including the W-recess. For example, the processor 1260 may compare data measured from the optical metrology target to predicted data based on one or more models for the optical metrology target. For example, the measured data may be obtained by measuring the optical metrology target at one or more azimuth angles and/or AoI. Parameters of the model are varied, and predicted data compared to the measured data, e.g., in a linear regression process, until a good fit is achieved between the predicted data and the measured data, at which time the modeled parameters are determined to be the characteristic, e.g., the W-recess vertical profile, of the optical metrology target and by extension the NAND device under test. Multiple areas of the optical metrology target, e.g., having different via to WL slit distances, may be measured and used in a multimodal, global fitting process to determine the characteristic, e.g., the W-recess vertical profile, in the different areas in the optical metrology target, and by extension the NAND device under test.

The processor 1260, which includes at least one processing unit 1262 with memory 1264, as well as a user interface including e.g., a display 1266 and input devices 1268. A non-transitory computer-usable storage medium 1269 having computer-readable program code embodied may be used by the processor 1260 for causing the at least one processor to control the optical metrology device 1200 and to perform the functions including the analysis described herein. The data structures and software code for automatically implementing one or more acts described in this detailed description can be implemented by one of ordinary skill in the art in light of the present disclosure and stored, e.g., on a computer-usable storage medium 1269, which may be any device or medium that can store code and/or data for use by a computer system such as processing unit 1262. The computer-usable storage medium 1269 may be, but is not limited to, flash drive, magnetic and optical storage devices such as disk drives, magnetic tape, compact discs, and DVDs (digital versatile discs or digital video discs). A communication port 1267 may also be used to receive instructions that are used to program the processor 1260 to perform any one or more of the functions described herein and may represent any type of communication connection, such as to the internet or any other computer network. The communication port 1267 may further export signals, e.g., with measurement results and/or instructions, to another system, such as external process tools, in a feed forward or feedback process in order to adjust a process parameter associated with a fabrication process step of the samples based on the measurement results. Additionally, the functions described herein may be embodied in whole or in part within the circuitry of an application specific integrated circuit (ASIC) or a programmable logic device (PLD), and the functions may be embodied in a computer understandable descriptor language which may be used to create an ASIC or PLD that operates as herein described. The results from the analysis of the data may be stored, e.g., in memory 1264 associated with the sample 1201 and/or provided to a user, e.g., via display 1266, an alarm or other output device. Moreover, the results from the analysis may be fed back to the process equipment to adjust the appropriate patterning step to compensate for any detected variances in the multiple patterning process.

FIG. 13 is a flow chart illustrating a method of measuring a characteristic of a trench in a device under test, such as the tungsten-recess vertical profile in a wordline in a three-dimensional (3D) NAND. As illustrated, the method includes producing an optical metrology target on a wafer with the device under test (1302). The optical metrology target includes a tier stack comprising a plurality of tier stack pairs, each tier stack comprising a conductor layer and an insulator layer, the tier stack comprising a trench extending through the tier stack; and a plurality of vias extending through the plurality of tier stack pairs, wherein a lateral distance from a via to the trench promotes access of light to a bottom of the trench for measurement of the characteristic of the trench, e.g., as illustrated in FIGS. 5A, 5B, and 5C. Light with wavelengths longer than a plasmon frequency of the conductor layer in each tier stack pair is produced with an optical metrology device, such as optical metrology device 1200, that is focused on the optical metrology target, wherein plasmonic resonance of the light promotes access of the light to the bottom of the trench, e.g., as illustrated in FIG. 6 (1304). For example, the conductor layer comprise tungsten and the wavelengths of light may be longer than 2500 nm. In some implementations, shorter wavelengths may be used if the wavelengths are longer than the plasmon frequency of the tungsten, i.e., Epsilon_1 of the dielectric function is negative. Light returned from the optical metrology target is detected with the optical metrology device (1306). The detected light is used to measure the characteristic of the trench (1308).

In some implementations, the device under test is a 3D NAND, the trench is a wordline slit, the conductor layer comprises tungsten, and the characteristic of the trench comprises a tungsten recess vertical profile.

In some implementations, the light produced with the optical metrology device may be produced at one of multiple angles of incidence, multiple azimuth angles, or a combination thereof. The detected light to measure the characteristic of the trench may be light produced at the one of the multiple angles of incidence, the multiple azimuth angles, or the combination thereof, as discussed in reference to FIG. 10.

In some implementations, the optical metrology target is a first optical metrology target and the lateral distance from the via to the trench is a first lateral distance from a first via to a first trench. A second optical metrology target may be produced, e.g., at the same time as the first optical metrology target and the device under test. The second optical metrology target includes the tier stack and a second lateral distance from a second via to a second trench that promotes access of light to a bottom of the second trench and that is different than the first lateral distance. Light is produced with wavelengths longer than the plasmon frequency of the conductor layer in each tier stack pair with the optical metrology device that may be focused on the second optical metrology target, wherein the plasmonic resonance of the light promotes access of the light to the bottom of the second trench. Light returned from the second optical metrology target is detected with the optical metrology device. The detected light from the second optical metrology target may be used with the detected light from the first optical metrology target to determine the characteristic of the trench in the device under test, e.g., as discussed in reference to FIG. 10 and FIGS. 11A and 11B.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. A wafer comprising an optical metrology target for measuring a characteristic of a trench in a device under test, wherein the trench has a depth that is difficult for light to reach to a bottom of the trench, the optical metrology target comprising:
   a tier stack comprising a plurality of tier stack pairs, each tier stack pair comprising a conductor layer and an insulator layer, the tier stack comprising the trench vertically extending through the plurality of tier stack pairs; and
   a plurality of vias extending through the plurality of tier stack pairs, each via having insulating sidewalls and filled with a conductor material, wherein a lateral distance from a via to the trench promotes access of light to a bottom of the trench in the optical metrology target for measurement of the characteristic of the trench.

2. The wafer comprising the optical metrology target of claim 1, wherein the device under test is a three-dimensional (3D) NAND, the trench is a wordline slit, the conductor layer comprises tungsten, and wherein the characteristic of the trench comprises a tungsten recess vertical profile.

3. The wafer comprising the optical metrology target of claim 1, wherein the lateral distance from the via to the trench promotes plasmonic resonance for the light that promotes access of the light to the bottom of the trench.

4. The wafer comprising the optical metrology target of claim 1, wherein the optical metrology target comprises a same number of the plurality of tier stack pairs and same trench characteristics as the device under test, wherein the device under test does not include vias corresponding to the plurality of vias in the optical metrology target.

5. The wafer comprising the optical metrology target of claim 1, wherein the tier stack is opaque to the light.

6. The wafer comprising the optical metrology target of claim 1, wherein the optical metrology target satisfies all design rules for the device under test.

7. The wafer comprising the optical metrology target of claim 1, wherein the plurality of vias in the tier stack provides structural support to the tier stack.

8. The wafer comprising the optical metrology target of claim 1, wherein the optical metrology target is a first optical metrology target and the lateral distance from the via to the trench is a first lateral distance from a first via to a first trench, the wafer further comprising a second optical metrology target comprising the tier stack and having a second lateral distance from a second via to a second trench that promotes access of light to a bottom of the second trench for measurement of the characteristic of the trench and that is different than the first lateral distance.

9. The wafer comprising the optical metrology target of claim 1, wherein the lateral distance from the via to the trench promotes access to the bottom of the trench in the optical metrology target for light having wavelengths that are longer than a plasmon frequency of the conductor layer.

10. The wafer comprising the optical metrology target of claim 1, wherein the lateral distance from the via to the trench promotes access to the bottom of the trench in the optical metrology target for light having wavelengths that are longer than 2500 nm.

11. The wafer comprising the optical metrology target of claim 1, wherein the plurality of vias are present in the optical metrology target in place of channel holes in the device under test but the plurality of vias do not model the channel holes in the device under test.

12. A wafer comprising an optical metrology target for measuring a characteristic of a trench, wherein the trench has a depth that is difficult for light to reach to a bottom of the trench, the optical metrology target comprising:
   a tier stack comprising a plurality of tier stack pairs, the tier stack comprising a trench vertically extending through the plurality of tier stack pairs; and
   a plurality of vias extending through the plurality of tier stack pairs, the plurality of vias comprising a means for promoting access of light to the bottom of the trench for measurement of the characteristic of the trench.

13. The wafer comprising the optical metrology target of claim 12, wherein the optical metrology target is for a three-dimensional (3D) NAND, the trench is a wordline slit, a conductor layer in each tier stack pair comprises tungsten, and wherein the characteristic of the trench comprises a tungsten recess vertical profile.

14. The wafer comprising the optical metrology target of claim 12, wherein the means for promoting access of light to the bottom of the trench promotes plasmonic resonance for the light that promotes access of the light to the bottom of the trench.

15. The wafer comprising the optical metrology target of claim 12, wherein the optical metrology target comprises a same number of the plurality of tier stack pairs and trench characteristics as a device under test, wherein a device under test does not include vias corresponding to the plurality of vias in the optical metrology target.

16. The wafer comprising the optical metrology target of claim 12, wherein the tier stack is opaque to the light.

17. The wafer comprising the optical metrology target of claim 12, wherein the optical metrology target satisfies all design rules for a device under test.

18. The wafer comprising the optical metrology target of claim 12, wherein the plurality of vias in the tier stack provides structural support to the tier stack.

19. The wafer comprising the optical metrology target of claim 12, wherein the optical metrology target is a first optical metrology target and the means for promoting access of light to the bottom of the trench is a first means for promoting access of light, the wafer further comprising a second optical metrology target comprising the tier stack and a second trench and a second means for promoting access of light to a bottom of the second trench.

20. The wafer comprising the optical metrology target of claim 12, wherein the means for promoting access to the bottom of the trench is for light having wavelengths that are longer than a plasmon frequency of a conductor layer in each tier stack pair.

21. The wafer comprising the optical metrology target of claim 12, wherein the means for promoting access to the bottom of the trench is for light having wavelengths that are longer than 2500 nm.

22. The wafer comprising the optical metrology target of claim 12, wherein the plurality of vias are present in the optical metrology target in place of channel holes in a device under test but the plurality of vias do not model the channel holes in the device under test.

23. An optical metrology device configured to measure a characteristic of a trench in a device under test using an optical metrology target on a wafer with the device under test, the optical metrology target comprising a tier stack comprising a plurality of tier stack pairs, each tier stack pair comprising a conductor layer and an insulator layer, the tier stack comprising a trench extending through the tier stack, and a plurality of vias extending through the plurality of tier stack pairs, wherein a lateral distance from a via to the trench promotes access of light to a bottom of the trench for measurement of the characteristic of the trench, the optical metrology device comprising:
- a light source that produces light to be directed to and interact with the optical metrology target, the light produced by the light source having wavelengths longer than a plasmon frequency of the conductor layer in each tier stack pair, wherein plasmonic resonance of the light promotes access of the light to the bottom of the trench, wherein the light is directed to the optical metrology target;
- at least one detector that receives the light that is returned from the optical metrology target; and
- at least one processor coupled to the at least one detector, wherein the at least one processor is configured to use detected light to measure the characteristic of the trench.

24. The optical metrology device of claim 23, wherein the device under test is a three-dimensional (3D) NAND, the trench is a wordline slit, the conductor layer comprises tungsten, and wherein the characteristic of the trench comprises a tungsten recess vertical profile.

25. The optical metrology device of claim 23, wherein:
- the light produced by the light source is directed to the optical metrology device with at least one of multiple angles of incidence, multiple azimuth angles, or a combination thereof; and
- the at least one processor is configured to use the detected light to measure the characteristic of the trench based on the one of the multiple angles of incidence, the multiple azimuth angles, or the combination thereof.

26. The optical metrology device of claim 23, wherein the optical metrology target is a first optical metrology target and the lateral distance from the via to the trench is a first lateral distance from a first via to a first trench, wherein the wafer with the device under test comprises a second optical metrology target comprising the tier stack and a second lateral distance from a second via to a second trench that promotes access of light to a bottom of the second trench and that is different than the first lateral distance, wherein:
- the light source produces light to be directed to and interact with the second optical metrology target, the light source produces light with the wavelengths longer than the plasmon frequency of the conductor layer in each tier stack pair in the second optical metrology target, wherein the plasmonic resonance of the light promotes access of the light to the bottom of the second trench; and
- the at least one detector receives the light that is returned from the second optical metrology target;
- wherein the at least one processor is further configured to use the detected light from the second optical metrology target with the detected light from the first optical metrology target to determine the characteristic of the trench in the device under test.

27. The optical metrology device of claim 23, wherein optical metrology device comprises one of a reflectometer, ellipsometer, Mueller Matrix ellipsometer, Fourier-transform infrared spectroscopy (FTIR).

28. The optical metrology device of claim 23, wherein the light produced by the light source has wavelengths longer than 2500 nm.

29. The optical metrology device of claim 23, wherein the plurality of vias are present in the optical metrology target in place of channel holes in the device under test but the plurality of vias do not model the channel holes in the device under test.

30. The optical metrology device of claim 23, wherein the optical metrology target comprises a same number of the plurality of tier stack pairs and a same trench characteristics as the device under test, wherein the device under test does not include vias corresponding to the plurality of vias in the optical metrology target.

* * * * *